(12) United States Patent
Ivanov et al.

(10) Patent No.: US 6,819,148 B2
(45) Date of Patent: Nov. 16, 2004

(54) CMOS COMPARATOR OUTPUT STAGE AND METHOD

(75) Inventors: Vadim V. Ivanov, Tucson, AZ (US);
Shoubao Yan, Tucson, AZ (US);
Walter B. Meinel, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 341 days.

(21) Appl. No.: 10/201,816

(22) Filed: Jul. 23, 2002

(65) Prior Publication Data

US 2004/0017226 A1 Jan. 29, 2004

(51) Int. Cl.[7] ................................................. H03K 3/00
(52) U.S. Cl. .................. 327/108; 327/112; 326/85; 326/87
(58) Field of Search ........................... 327/108, 112, 327/77, 63, 407, 409; 326/82, 83, 86, 87, 91, 85, 26, 27

(56) References Cited

U.S. PATENT DOCUMENTS

| | | | | | |
|---|---|---|---|---|---|
| 5,560,230 | A | * | 10/1996 | Ahn et al. | .................. 375/259 |
| 6,081,140 | A | * | 6/2000 | King | .......................... 327/77 |
| 6,292,037 | B1 | * | 9/2001 | Itoh | ........................... 327/112 |
| 6,373,295 | B2 | * | 4/2002 | Kadanka et al. | ............ 327/108 |

OTHER PUBLICATIONS

"A 1mV Resolution, 10MS/s Rail–to–Rail Comparator in 0.5–μm Low–Voltage CMOS Process" by Roberto Rivoir and Franco Maloberti, IEEE International Symposium on Circuits and Systems, Jun. 9–12, 1997, pp. 461–464.
"Analog VLSI Design of Multi–Phase Voltage Doublers with Frequency Reguation" by Fengjing Aiu, Janusz A. Starzyk and Ying–Wei Jan, IEEE, 1999, pp. 9–14.

* cited by examiner

Primary Examiner—Tuan T. Lam
Assistant Examiner—Hiep Nguyen
(74) Attorney, Agent, or Firm—W. Daniel Swayze, Jr.; W. James Brady; Frederick J. Telecky, Jr.

(57) ABSTRACT

A CMOS circuit including a P-channel pull-up transistor (MP) and an N-channel pull-down transistor (MN) includes a first feedback circuit (6) producing a first delayed signal, ($V_7$) on the gate of the pull-down transistor (MN) to turn on the pull-down transistor (MN) a first predetermined amount of time after the pull-up transistor (MP) is turned completely off so as to prevent any shoot-through current from flowing through the pull-up transistor (MP) and the pull-down transistor (MN) and a second feedback circuit (4) producing a second delayed signal ($V_5$) on the gate of the pull-up transistor (MP) to turn on the pull-up transistor (MP) a second predetermined amount of time after the pull-down transistor (MN) is turned completely off so as to prevent any shoot-through current from flowing through the pull-up transistor (MP) and the pull-down transistor (MN).

13 Claims, 5 Drawing Sheets

CMOS COMPARATOR OUTPUT STAGE AND METHOD

BACKGROUND OF THE INVENTION

The invention relates to CMOS circuitry, and more particularly to circuitry for eliminating shoot-through currents in complementary output stages of CMOS circuitry, and still more particularly to preventing shoot-through currents during switching of output stages of CMOS comparators.

The output stages of CMOS comparators usually are designed using a complementary CMOS inverter having large pull-up transistors and large pull-down transistors. See the paper "A 1 Mv Resolution, 10 Ms/s Rail-to-Rail Comparator in 0.5 µm Low-Voltage CMOS Process", by R. River and F. Maloberti, ISCAS-97, pages 461–464. The input voltage of the CMOS inverter changes relatively slowly during switching because the rise times and fall times thereof are limited by the amount of current which can be supplied from the previous input stage to charge and discharge the large gate capacitances of the pull-up and pull-down transistors of the CMOS inverter. Consequently, there is a relatively large amount of time during which both the pull-up transistors and the pull-down transistors are simultaneously on. This causes large "shoot-through" currents to flow from the positive voltage supply rail through the simultaneously on pull-up and pull-down transistors to the negative voltage supply rail. The large shoot-through current increases the current consumption of the CMOS comparator circuit, which is especially significant for low-power CMOS comparators being operated at high switching speeds. The large shoot-through currents also generate noise and EMI that may adversely affect other circuitry that is coupled to the CMOS comparator. Large shoot-through currents in CMOS circuits also may cause undesirable noise in power line conductors supplying power to the CMOS circuits.

Some prior art circuits utilize non-overlapping drivers circuits to drive the gates of the P-channel pull-up transistor and the N-channel pull-down transistor so as to prevent shoot-through currents, as shown in FIG. 9 of "Analog VLSI Design of Multi-Phase Voltage Doublers with Frequency Regulation" by Fengjing Aiu, Janusz A. Starzyk and Ying-Wei Jan, 1999 Southwest Symposium on Mixed-Signal Design, pages 9–14. Other prior art circuits operate to provide a "dead time" between the switching off of one of the pull-up and pull-down transistors and the switching on of the other.

For a long time there has been an unmet need for a simple, effective, inexpensive way of preventing shoot-through current in CMOS circuitry, especially CMOS comparators.

SUMMARY OF THE INVENTION

Accordingly, it is an object of the invention to provide reduced shoot-through currents in an output stage of a CMOS comparator.

It is another object of the invention to provide reduced shoot-through currents in a CMOS circuit.

It is another object of the invention to provide reduced shoot-through currents in a CMOS power inverter circuit.

It is another object of the invention to provide reduced EMI (electromagnetic interference) in a CMOS comparator circuit.

It is another object of the invention to reduce power line noise generated by shoot-through currents in CMOS circuitry.

It is another object of the invention to reduce current consumption of CMOS switching circuitry.

It is another object of the invention to reduce EMI caused by CMOS switching circuitry.

It is another object of the invention to provide a CMOS comparator having reduced current consumption and noise caused by shoot-through currents.

Briefly described, and in accordance with one embodiment thereof, the invention provides a CMOS circuit that includes a P-channel pull-up transistor (MP) and an N-channel pull-down transistor (MN), and also includes a first feedback circuit (6 or 13A) producing a first delayed signal ($V_7$ or $V_{GMN}$) on the gate of the pull-down transistor (MN) to turn on the pull-down transistor (MN) a first predetermined amount of time after the pull-up transistor (MP) is turned completely off, so as to prevent any shoot-through current from flowing through the pull-up transistor (MP) and the pull-down transistor (MN). The CMOS circuit also includes a second feedback circuit (4 or 14A) producing a second delayed signal ($V_5$ or $V_{GMP}$) on the gate of the pull-up transistor (MP) to turn on the pull-up transistor (MP) a second predetermined amount of time after the pull-down transistor (MN) is turned completely off, so as to prevent any shoot-through current from flowing through the pull-up transistor (MP) and the pull-down transistor (MN).

In one embodiment, the invention provides a CMOS circuit including a P-channel pull-up transistor (MP) and an N-channel pull-down transistor (MN), a P-channel first transistor (M1) having a source coupled to a first supply voltage (V+) and a gate coupled to a first input terminal (2A) for receiving a first input current ($I_{in1}$), and an N-channel second transistor (M2) having a source coupled to a second supply voltage (V−) and a gate coupled to a second input terminal (2B) for receiving a second input current ($I_{in2}$). A P-channel third transistor (M1A) has a source coupled to the first supply voltage (V+), a gate coupled to the first input terminal (2A), and a drain coupled to a gate of the pull-up transistor (MP). An N-channel fourth transistor (M2A) has a source coupled to the second supply voltage (V−) and a gate coupled to the second input terminal (2B). A first feedback circuit (13A) has an input coupled to the gate of the pull-up transistor (MP) and an output coupled to a gate of a P-channel fourth transistor (M3) having a source coupled to a drain of the first transistor (M1) and a drain coupled to a gate of the pull-down transistor (MN) and a drain of the second transistor (M2). A second feedback circuit (14A) has an input coupled to the gate of the pull-down transistor (MN) and an output coupled to a gate of an N-channel sixth transistor (M4) having a source coupled to a drain of the fourth transistor and a drain coupled to the gate of the pull-up transistor (MP). The first feedback circuit (13A) produces a first delayed signal ($V_{13}$) on the gate of the fifth transistor (M3) which causes the fifth transistor to turn on the pull-down transistor (MN) a first predetermined amount of time after the pull-up transistor (MP) is turned completely off, so as to prevent any shoot-through current from flowing through the pull-up transistor (MP) and the pull-down transistor (MN). The second feedback circuit (14A) produces a second delayed signal ($V_{14}$) on the gate of the sixth transistor (M4) which causes the sixth transistor to turn on the pull-up transistor (MP) a second predetermined amount of time after the pull-down transistor (MN) is turned completely off, so as to prevent any shoot-through current from flowing through the pull-up transistor (MP) and the pull-down transistor (MN). In this described embodiment, the first ($I_{in1}$) and second ($I_{in2}$) input currents are produced by a differential folded cascode stage of a differential input stage of a CMOS comparator circuit.

In one described embodiment, the first feedback circuit (13A) includes a first CMOS inverter (13), a first current source (I1) coupled between the first CMOS inverter (13) and the second supply voltage (V−), an input coupled to the gate of the pull-up transistor (MP), and an output coupled to the gate of the fifth transistor (M3). The second feedback circuit (14A) includes a second CMOS inverter (14), a second current source (I0) coupled between the second CMOS inverter (14) and the first supply voltage (V+), an input coupled to the gate of the pull-down transistor (MN), and an output coupled to the gate of the sixth transistor (M4). In one described embodiment, the first CMOS inverter (13) includes a P-channel seventh transistor (MP1) having a source coupled to the first supply voltage (V+) and an N-channel eighth transistor (M5) having a drain coupled to the drain of the seventh transistor (MP1) and a source coupled to the first current source (I1). The second CMOS inverter (14) includes an N-channel ninth transistor (MN1) having a source coupled to the second supply voltage (V−) and a P-channel 10th transistor (M6) having a drain coupled to the drain of the ninth transistor (MN1) and a source coupled to the second current source (I0).

In another embodiment, the invention provides a method of preventing shoot-through currents in a CMOS circuit including a P-channel pull-up transistor (MP) and an N-channel pull-down transistor (MN), by providing a first feedback circuit (6 or 13A) having an input coupled to a gate of the pull-up transistor (MP) and an output coupled to a gate of the pull-down transistor (MN), and a second feedback circuit (4 or 14A) having an input coupled to the gate of the pull-down transistor (MN) and an output coupled to the gate of the pull-up transistor (MP). A first delayed signal ($V_7$ or $V_{GMN}$) is produced on the gate of the pull-down transistor (MN) in response to a first signal ($V_5$ or $V_{GMP}$) on the gate of the pull-up transistor (MP) by means of the first feedback circuit (6 or 13A) to turn on the pull-down transistor (MN) a first predetermined amount of time after the pull-up transistor (MP) is turned completely off so as to prevent any shoot-through current from flowing through the pull-up transistor (MP) and the pull-down transistor (MN). A second delayed signal ($V_5$ or $V_{GMP}$) is produced on the gate of the pull-up transistor (MP) in response to a second signal ($V_7$ or $V_{GMN}$) on the gate of the pull-down transistor (MN) by means of the second feedback circuit (4 or 14A) to turn on the pull-up transistor (MP) a second predetermined amount of time after the pull-down transistor (MN) is turned completely off so as to prevent any shoot-through current from flowing through the pull-up transistor (MP) and the pull-down transistor (MN). The first signal ($V_5$ or $V_{GMP}$) is produced on the gate of the pull-up transistor (MP) in response to a transition of an input signal to a first level, and the second signal ($V_7$ or $V_{GMN}$) is produced on the gate of the pull-down transistor (MN) in response to a transition of the input signal to a second level.

DETAILED DESCRIPTION OF THE PREFERRED EMBODIMENTS

Figure 1:
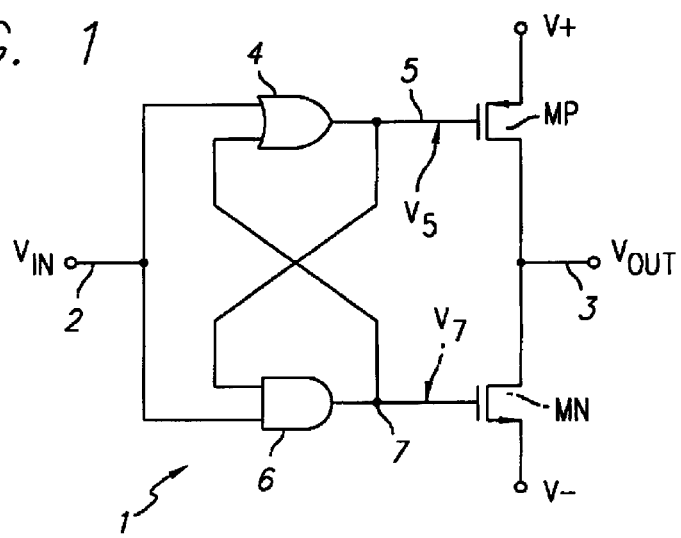
FIG. 1 is a generalized schematic diagram of a CMOS output stage of the present invention.

Referring to FIG. 1, a CMOS output stage 1 receives an input $V_{IN}$ on conductor 2 from an input stage. Conductor 2 is connected to one input of a two-input OR gate 4 and also to one input of a two-input AND gate 6. The output of OR gate 4 is connected by conductor 5 to the gate of the P-channel pull-up output transistor MP and also to the other input of AND gate 6. A voltage $V_5$ is conducted by conductor 5. The output of AND gate 6 is connected by conductor 7 to the gate of an N-channel pull-down output transistor MN and also to the other input of OR gate 4. A voltage $V_7$ is conducted by conductor 7. The source of pull-up transistor MP is connected to a positive supply voltage V+, and the drain of pull-up transistor MP is connected to an output conductor 3 on which an output voltage $V_{OUT}$ is produced. The source of pull-down transistor MN is connected to a low supply voltage V−, and the drain of pull-down transistor MN is connected to output conductor 3.

In operation, the gate voltage $V_7$ of pull-down transistor MN on conductor 7 can be considered to be an indicator of whether or not any current is flowing in pull-down transistor MN. Therefore, if there is a current in pull-down transistor MN of CMOS output stage 1, then the VGS voltage of pull-down transistor MN exceeds the its threshold voltage because a "1" is being maintained on conductor 7 by AND gate 6. The "1" on conductor 7 is fed back to one input of OR gate 4, causing it to produce a "1" level of $V_5$ on conductor 5. The "1" level on conductor 5 continues to prevent pull-up transistor MP from being turned on, irrespective of the value of $V_{IN}$. Thus, the local feedback provided by OR gate 4 from the gate of pull-down transistor MN to the gate of pull-up transistor MP prevents pull-up transistor MP from being turned on if there is current present in pull-down transistor MN, and therefore prevents shoot-through current from V+ to V− through transistors MP and MN irrespective of the value of $V_{IN}$.

Similarly, if there is a current in pull-up transistor MP, then the $V_{GS}$ voltage of pull-up transistor MP exceeds its threshold voltage because a low "0" voltage level is being maintained on conductor 5 by OR gate 4. That "0" level on conductor 5 is fed back to an input of AND gate 7, which results in a low "0" voltage level being applied by conductor 7 to the gate of pull-down transistor MN, keeping it off irrespective of the value of $V_{IN}$. Thus, the local feedback provided by AND gate 6 from the gate of pull-up transistor MP to the gate of pull-down transistor MN prevents pull-down transistor MN from being turned on if there is current present in pull-up transistor MP, and therefore prevents shoot-through current from V+ to V− irrespective of the value of $V_{IN}$. (Note that increasing $V_{IN}$ to a high level forces OR gate 4 to produce a high value of $V_5$ which turns off pull-up transistor MP, and similarly, decreasing $V_5$ to a low level forces AND gate 6 to a low level which turns pull-down transistor MN off.)

Figure 5A:
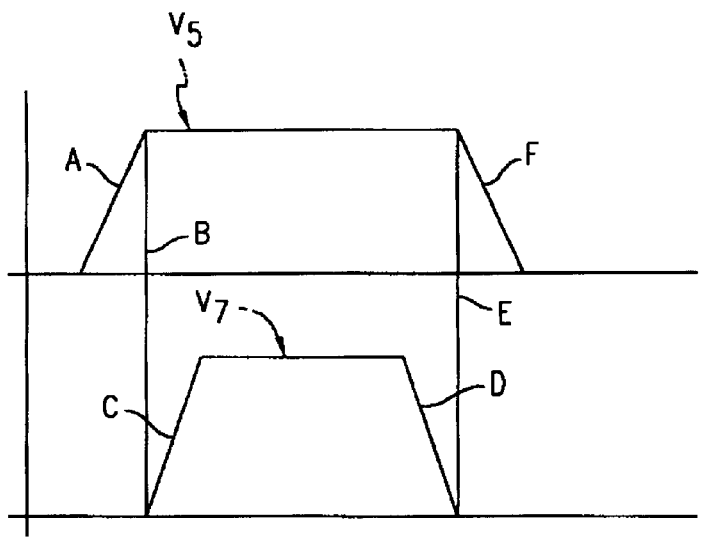
FIG. 5A is a timing diagram showing waveforms for $V_5$ and $V_7$ in FIG. 1.

The waveforms shown in FIG. 5A also illustrate the operation of the output circuit 1 of FIG. 1. AND gate 6 is designed so that as $V_5$ increases along segment A in FIG. 5A, its output does not switch to a high level until $V_5$ has nearly reached its maximum "1" level at a time indicated by dashed line B. At that point, the output of AND gate 6 switches, as indicated by segment C of the $V_7$ waveform.

Similarly, OR gate 4 is designed so that as $V_7$ falls as indicated by segment D of the $V_7$ waveform, OR gate 4 does not switch until $V_7$ along segment D nearly reaches its minimum "0" level at the time indicated by dashed line E, at which time OR gate 4 switches as indicated by segment F of the $V_5$ waveform. Note that the times represented by the vertical dashed lines Be can be readily established by the transfer characteristics of AND gate 6 and OR gate 4.

Figure 2A:
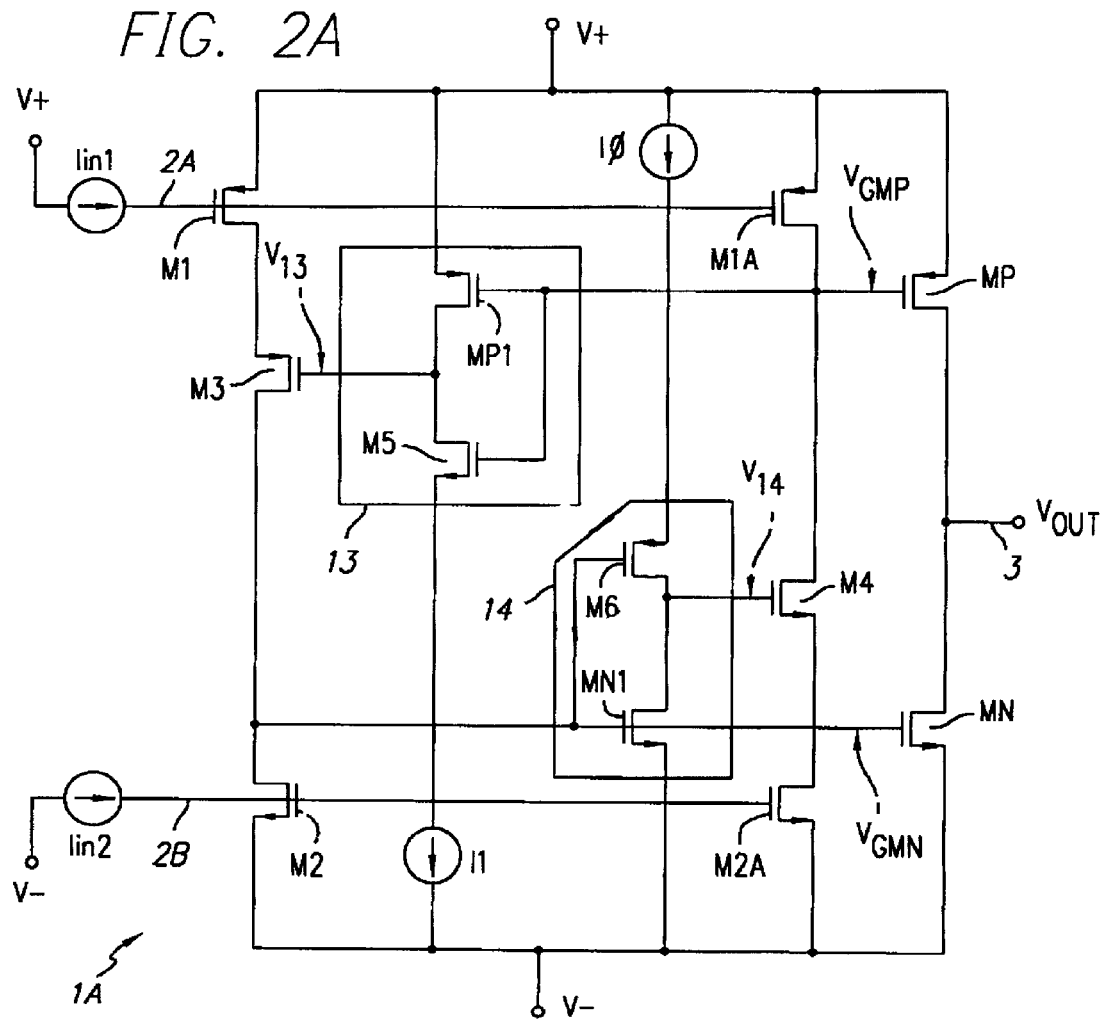
FIG. 2A is a detailed schematic diagram of a CMOS comparator output stage according to the present invention.
Figure 4:
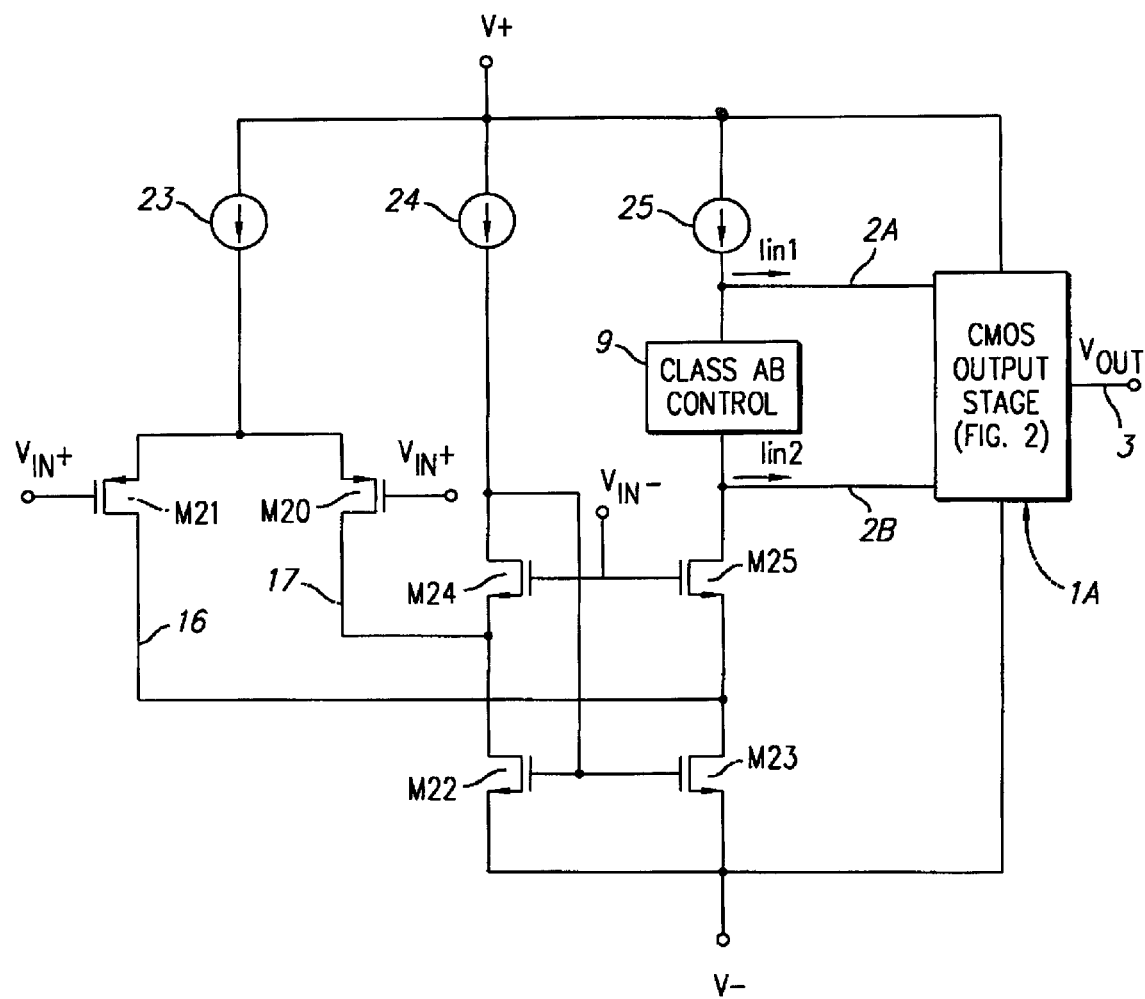
FIG. 4 is schematic diagram of a CMOS comparator circuit including the output stage of FIG. 2A.

FIG. 2A shows a schematic diagram of another CMOS output stage 1A which is adapted to receive the current output signals $I_{in1}$ and $I_{in2}$ produced by folded cascode circuitry of a differential CMOS comparator input stage (as shown in FIG. 4).

$I_{in1}$ can be modeled as a first current source that represents one output of a differential folded cascode circuit of an input stage, and is applied via conductor 2A to the gate of a P-channel transistor M1 having its source connected to V+ and also to the gate of the P-channel transistor M1A having its source connected to V+.

Similarly, $I_{in2}$ can be modeled as a second current source that represents the other output of the differential folded cascode circuit. The drain of transistor M1 is connected to the source of a P-channel transistor M3. The drain of transistor M3 is connected to the gate of an N-channel pull-down transistor MN, the gate of an N-channel transistor MN1, the gate of a P-channel transistor M6, and the drain of an N-channel transistor M2. The voltage on the gate of pull-down transistor MN is $V_{GMN}$. The sources of transistors M2 and MN are connected to V−.

The gate of transistor M3 is connected to the drains of a P-channel transistor MP1 and a N-channel transistor M5 which comprise a first CMOS inverter 13. The voltage applied to the gate of transistor M3 by CMOS inverter 13 is $V_{13}$. The source of transistor MP1 is connected to V+, and its gate is connected to the gate of transistor M5, the drain of transistor M1A, the gate of a P-channel pull-up transistor MP, and the drain of an N-channel transistor M4. The voltage on the gate of pull-up transistor MP is $V_{GMP}$. The source of transistor M5 is connected to one terminal of a current source I1, the other terminal of which is connected to V−. The source of pull-up transistor MP is connected to V+, and its drain is connected to $V_{OUT}$ conductor 3. The source of transistor M4 is connected to the drain of transistor M2A. The drain of transistor M6 is connected to the drain of transistor MN1 and to the gate of transistor M4.

Transistors M6 and MN1 comprise a second CMOS inverter 14, the output of which produces the voltage $V_{14}$ on the gate of transistor M4. The voltage applied to the gate of transistor M4 by the output of CMOS inverter 14 is $V_{14}$. The source of transistor M6 is connected to one terminal of a constant current source I0, the other terminal of which is connected V+.

A class AB control circuit can be coupled between conductors 2A and 2B to substantially increase the speed of a circuit (such as a CMOS comparator) that includes CMOS output stage 1A.

Figure 2B:
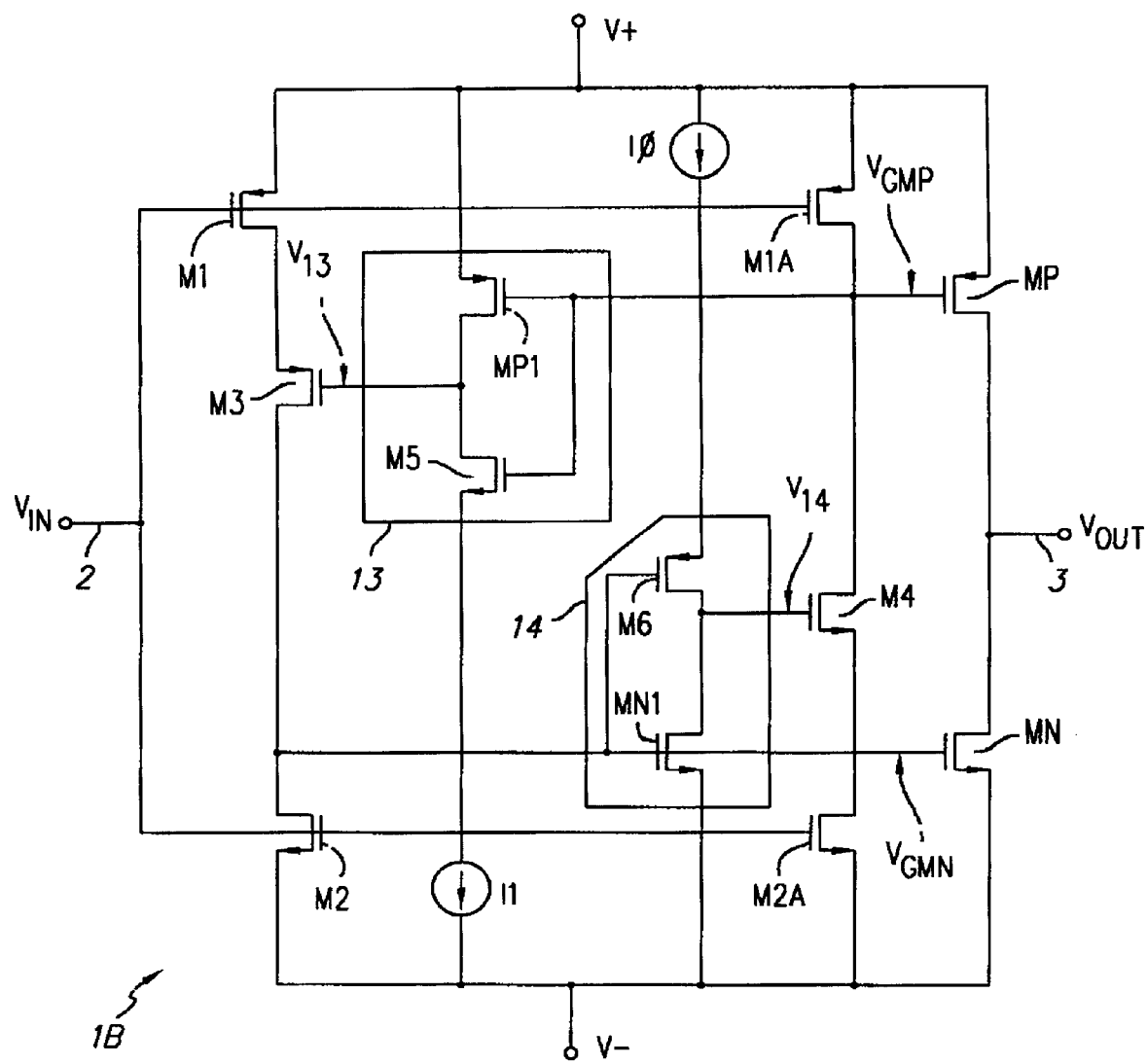
FIG. 2B is a detailed schematic diagram essentially identical to that of FIG. 2A except that its two input terminals are short-circuited together.

FIG. 2B shows a CMOS output stage 1B which is identical to the one shown in FIG. 2A except that the gates of transistors M1 and M2 are connected directly to an input conductor 2 conducting a voltage $V_{in}$.

In operation, $I_{in1}$ can be less than, equal to, or greater than $I_{in2}$, depending on the value of an input voltage $V_{in}=V_{in+}-V_{in-}$ being applied to an input stage (FIG. 4) that generates $I_{in1}$ and $I_{in2}$. Under static conditions, a current equal to the difference between Iin1 and Iin2 flows through an optional class AB control circuit 9 as shown in FIG. 4, subsequently described.

If $I_{in1}$ exceeds $I_{in2}$ then the voltages on conductors 2A and 2B increase, transistors M1 and M1A are turned off, and at the same time transistors M2 and M2A are turned on. Thus, transistor M2 is turned on, and the voltage on the gate of pull-down transistor MN goes lower, turning off pull-down transistor MN. The falling voltage applied to the gates of transistors MN1 and MN to turn them off also turns transistor M6 on, so the current I0 flows through transistor M6 and charges up the capacitance associated with gate of transistor M4. Since transistor M1A is already off, pull-up transistor MP is turned on after the delay that is required for the current I0 to turn transistor M4 on.

Similarly, if $I_{in1}$ is less than $I_{in2}$, then the voltages on conductors 2A and 2B decrease. This turns transistors M2 and M2A off, and at the same time turns transistors M1 and M1A on. As transistor M1A turns on, this increases the gate voltage of transistors MP and MP1, so transistors MP and MP1 are turned off, and transistor M5 is turned on. After the delay required for the current I1 to discharge the capacitance associated with gate of transistor M3, and hence after pull-up transistor MP is turned completely off, transistor M3 is turned on. This increases the gate voltage $V_{GMN}$ of pull-down transistor MN, turning it on only after pull-up transistor MP is completely turned off.

Figure 5B:
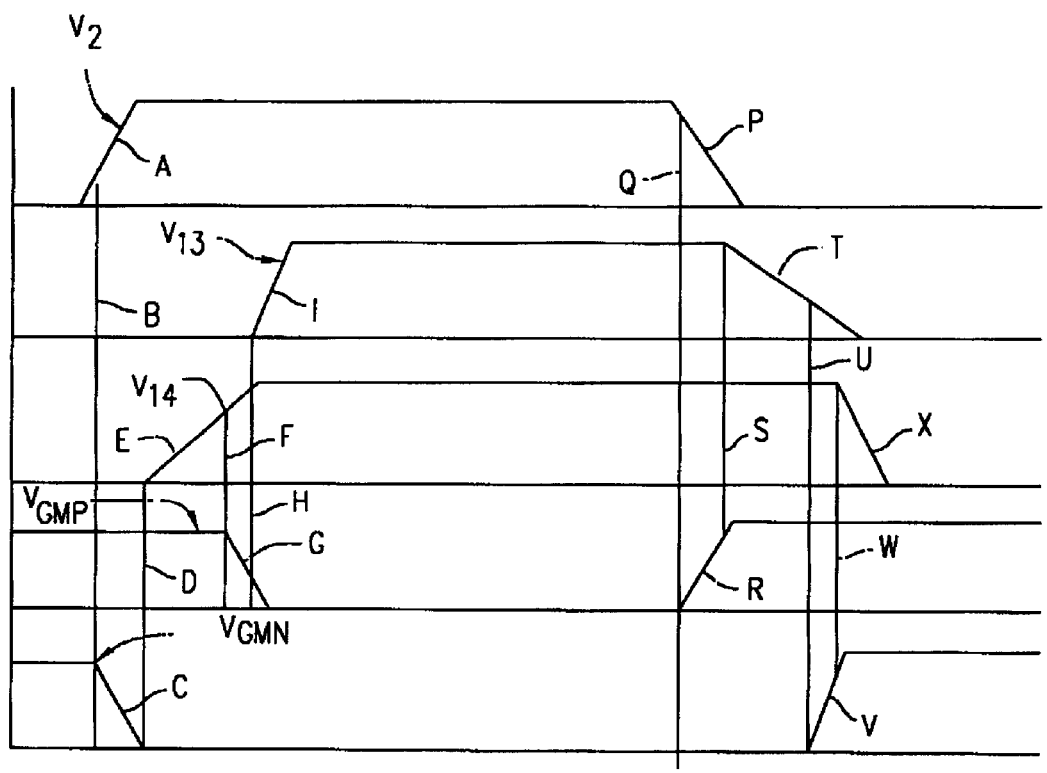
FIG. 5B is a timing diagram showing waveforms for $V_2$, $V_{13}$, $V_{14}$, $V_{GMP}$ and $V_{GMN}$ in FIG. 2.

The above operation can be further understood by reference to the waveforms of FIG. 5B for the output circuit 1B of FIG. 2B, which has the voltage waveform $V_2$ applied directly to the gates of transistors M1 and M2. Except for $V_2$, the waveforms of FIG. 5B are equally applicable to the output stage 1A of FIG. 2A.

Referring to FIG. 5B, as $V_2$ begins to increase along segment A of the $V_2$ waveform, transistor M2 begins to turn on at a time indicated by dashed line B, pulling $V_{GMN}$ toward a "0" level, as indicated by segment C of the $V_{GMN}$ waveform. Transistor M6 turns on at a time indicated by dashed line D, causing the output $V_{14}$ of CMOS inverter 14 to rise, as indicated by segment E of the $V_{14}$ waveform. The slope of segment E is determined by the value of the current I0 and the parasitic capacitances associated with the gate of transistor M4. As $V_{14}$ increases, it begins to turn transistor M4 on at a time indicated by dashed line F. This causes $V_{GMP}$ to decrease, as indicated by segment G of the $V_{GMP}$ waveform. (Also, the decreasing of $V_{GMP}$ causes the output $V_{13}$ of CMOS inverter 13 to begin to increase at a time H, as indicated by segment I of the $V_{13}$ waveform.)

Similarly, when $V_2$ begins to decrease as indicated by segment P of the $V_2$ waveform, transistor M1A begins to turn on at the time indicated by dashed line Q, causing $V_{GMP}$ to increase, as indicated by segment R of the $V_{GMP}$ waveform. That turns on transistor M5 at a time indicated by dashed line S, which causes the output $V_{13}$ of CMOS inverter 13 to decrease at a rate determined by the current I1 and the capacitances associated with gate of transistor M3, as indicated by segment T of the $V_{13}$ waveform. At a time indicated by dashed line U, transistor M3 begins to turn on, causing $V_{GMN}$ to rise as indicated by segment V of the $V_{GMN}$ waveform. (Also, as $V_{GMN}$ reaches a "1" level, at the time indicated by dashed line W, transistor MN1 begins to turn on, causing the output $V_{14}$ of CMOS inverter 14 to begin to decrease, as indicated by segment X of the $V_{14}$ waveform.)

The times at which the vertical dashed lines B, D, F, H, Q, S, U and W occur can be readily established by designing the transfer characteristics of CMOS inverter 13 and 14 and the associated circuitry in FIGS. 2A and 2B.

Figure 3:
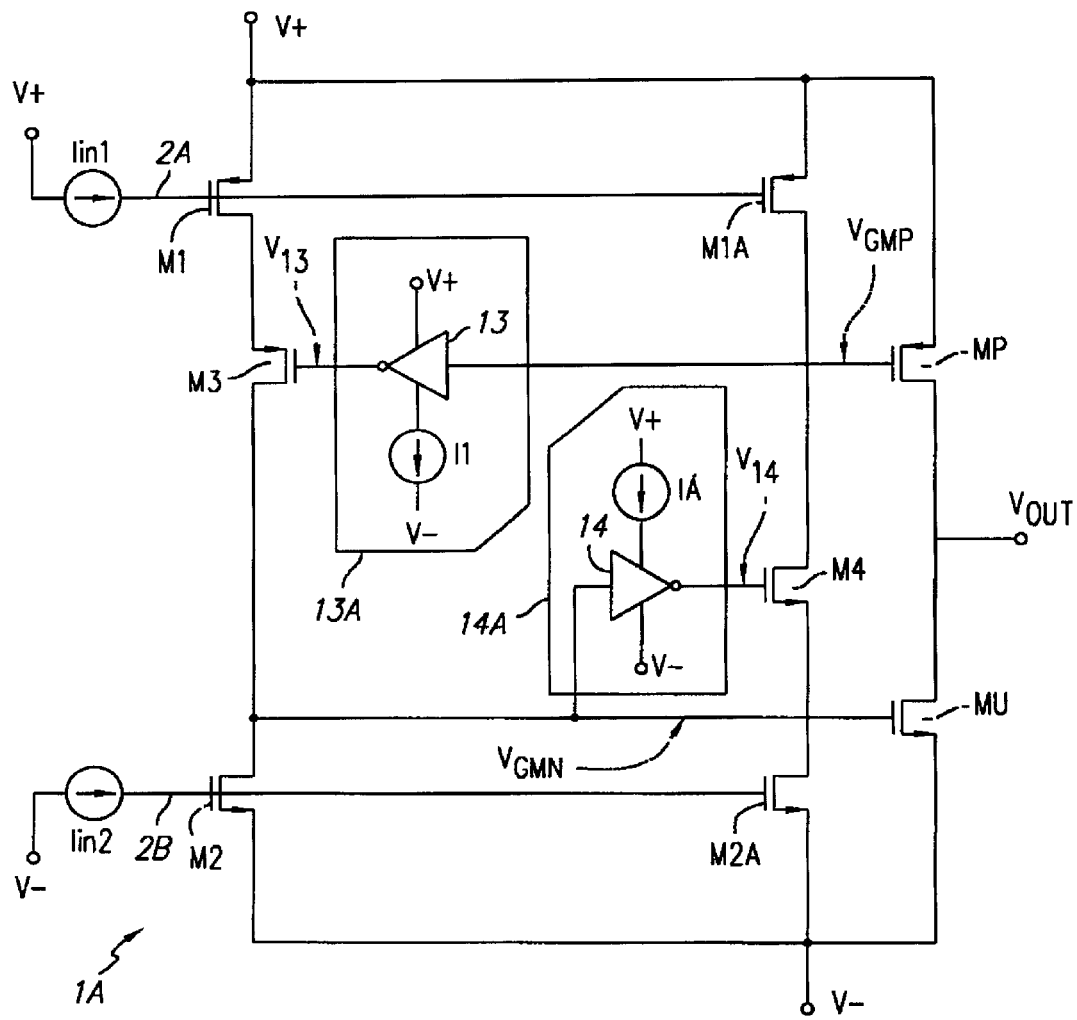
FIG. 3 is a simplified schematic diagram of the CMOS comparator output stage of FIG. 2A.

FIG. 3 shows a more generalized schematic diagram of the CMOS output stage 1A of FIG. 2A wherein the functions of CMOS inverters 13 and 14 can be more readily recognized. More specifically, the combination of CMOS inverter 13 and constant current source I1 connected in series between V+ and V− as shown provides a feedback circuit 13A that produces a delay between the time that pull-up transistor MP turns off and the time that pull-down transistor MN turns on. Similarly, the combination of CMOS inverter 14 and constant current source I0 connected in series between V+ and V− as shown provides a delay circuit 14A which produces a delay between the time that pull-down transistor MN turns off and pull-up transistor MP turns on. Typically, the delay produced by feedback circuit 13A and 14A is roughly 5–20 ns (nanoseconds). The relatively low values of currents I0 and I1 effectively limit the amount of shoot-through currents in CMOS inverters 13 and 14, in addition to creating the delay that prevents shoot-through currents in pull-up transistor MP and pull-down transistor MN. Note that transistor M3 can be considered to be a part of feedback circuit 13A, and similarly, transistor M4 can be considered to be a part of feedback circuit 14A.

FIG. 4 is a schematic diagram of a CMOS comparator circuit 10 including a differential input stage, a folded cascode stage, a class AB control circuit, and also including the CMOS output stage 1A of FIG. 2A. CMOS comparator 10 applies an input signal Vin =Vin+−Vin−between the gate of a P-channel input transistor M21 and the gate of a P-channel input transistor M20. The sources of input transistors M21 and M22 are coupled by a tail current source 23 to V+. The drain of input transistor M21 is connected by conductor 16 to the source of an N-channel cascode transistor M25 and to the drain of an N-channel load transistor M23 having its source connected to V−. Similarly, the drain of input transistor M20 is connected by conductor 17 to the source of an N-channel cascode transistor M24 and the drain of an N-channel load transistor M22, the source of which is connected to V−. The gates of cascode transistors M24 and M25 are connected to a reference voltage $V_{REF}$. The drain of cascode transistor M24 is coupled to V+ by a constant current source 24, and also is connected to the gates of load transistors M22 and M23. The drain of cascode transistor M25 is connected by conductor 2B to one terminal of optional class AB control circuit 9 and to one input of CMOS output stage 1A of FIG. 2A. The other terminal of class AB control circuit 9 is connected by conductor 2A to one terminal of constant current source 25 and to the other input of CMOS output stage 1A. Cascode transistors M24 and M25, load transistors M22 and M23, and constant current source is 24 and 25 comprise a typical differential folded cascode stage. (The details of class AB control circuit 9 are well-known to those skilled in the art, as evidenced by reference numeral 20 in FIG. 1 of U.S. Pat. No. 5,311,145 issued May 10, 1994 to Huijsing et al.)

Current source 25 in FIG. 4 functions as the current source $I_{in1}$ shown in FIG. 2A, and cascode transistor M25 and load transistor M23 in FIG. 4 together function as the current source $I_{in2}$ shown in FIG. 2A.

The above described embodiments of the present invention prevent shoot-through currents in complementary CMOS output transistors of a CMOS output stage by providing local feedback circuitry that prevents switching on of either one of the complementary output transistors while the other is turned on. The elimination of the shoot-through currents results in reduced current consumption of the CMOS output stage and a CMOS comparator including it, especially at high switching rates. The elimination of shoot-through currents also reduces EMI and other noise.

The connection of class AB control circuit 9 between conductors 2A and 2B instead of short-circuiting them together greatly increases the speed of the CMOS comparator of FIG. 4, because otherwise a large amount of time would be required for the relatively small currents produced by the differential input stage to charge and recharge the relatively large parasitic capacitances associated with conductors 2A and 2B through the 2–3 volt swings (transitions) typically required to switch output stage 1A. In contrast, embodiments of invention utilizing class AB control circuit 9 only require the currents produced by the differential input stage to charge the parasitic capacitances enough to cause conductors 2A and 2B to swing through a 200–300 millivolt swing in order to switch the output stage.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, the invention also is more generally applicable to eliminating shoot-through currents in any pair of complementary CMOS transistors coupled between two supply voltages. If the input terminals 2A and 2B are shorted together as in FIG. 2B, a folded cascode stage be used to produce the signal $V_{in}$ on conductor 2. The described technique also can be utilized were both the pull-up transistor and the pull-down transistor art of the same channel type.

What is claimed is:

1. A CMOS circuit including a P-channel pull-up transistor and an N-channel pull-down transistor, comprising:

(a) a P-channel first transistor having a source coupled to a first supply voltage and a gate coupled to a first input terminal for receiving a first input current, and an N-channel second transistor having a source coupled to a second supply voltage and a gate coupled to a second input terminal for receiving a second input current;

(b) a P-channel third transistor having a source coupled to the first supply voltage, a gate coupled to the first input terminal, and a drain coupled to a gate of the pull-up transistor, and an N-channel fourth transistor having a source coupled to the second supply voltage and a gate coupled to the second input terminal;

(c) a first feedback circuit having an input coupled to the gate of the pull-up transistor and an output coupled to a gate of a P-channel fifth transistor having a source coupled to a drain of the P-channel first transistor a drain coupled to a gate of the pull-down transistor and a drain of the N-channel second transistor, and a second feedback circuit having an input coupled to the gate of the pull-down transistor and an output coupled to a gate of an N-channel sixth transistor having a source coupled to a drain of the N-channel fourth transistor and a drain coupled to the gate of the pull-up transistor;

(d) the first feedback circuit producing a first delayed signal on the gate of the P-channel fifth transistor which causes the P-channel fifth transistor to turn on the pull-down transistor a first predetermined amount of time after the pull-up transistor is turned completely off so as to prevent any shoot-through current from flowing through the pull-up transistor and the pull-down transistor, the second feedback circuit producing a second delayed signal on the gate of the N-channel sixth transistor which causes the N-channel sixth transistor to turn on the pull-up transistor a second predetermined amount of time after the pull-down transistor is turned completely off so as to prevent any shoot-through current from flowing through the pull-up transistor and the pull-down transistor.

2. The CMOS circuit of claim 1 including a class AB control circuit coupled between the first and second input terminals.

3. The CMOS circuit of claim 1 wherein the first feedback circuit includes a first CMOS inverter, a first current source coupled between the first CMOS inverter and the second supply voltage, an input coupled to the gate of the pull-up transistor, and an output coupled to the gate of the P-channel fifth transistor.

4. The CMOS circuit of claim 1 wherein the P-channel fifth transistor is included in the first feedback circuit.

5. The CMOS circuit of claim 3 wherein the first CMOS inverter includes a P-channel seventh transistor having a source coupled to the first supply voltage and an N-channel eighth transistor having a drain coupled to the drain of the P-channel seventh transistor and a source coupled to the first current source.

6. The CMOS circuit of claim 3 wherein the second feedback circuit includes a second CMOS inverter, a second current source coupled between the second CMOS inverter and the first supply voltage, an input coupled to the gate of the pull-down transistor, and an output coupled to the gate of the N-channel sixth transistor.

7. The CMOS circuit of claim 6 wherein the N-channel sixth transistor is included in the second feedback circuit.

8. The CMOS circuit of claim 6 wherein the second CMOS inverter includes an N-channel ninth transistor having a source coupled to the second supply voltage and a P-channel tenth transistor having a drain coupled to the drain of the N-channel ninth transistor and a source coupled to the second current source.

9. The CMOS circuit of claim 1 wherein the first and second input currents are produced by a folded cascode stage of an input stage of a CMOS comparator circuit.

10. The CMOS circuit of claim 9 including a class AB control circuit coupled between the first and second input terminals.

11. The CMOS circuit of claim 9 wherein the input stage of the CMOS comparator circuit is a differential input stage, and wherein the folded cascode stage is a differential folded cascode stage of the differential input stage of the CMOS comparator circuit.

12. A method of preventing shoot-through current in a CMOS circuit including a P-channel pull-up transistor and an N-channel pull-down transistor, the method comprising:

(a) applying a first input current to a gate of a P-channel first transistor having a source coupled to a first supply voltage and to a gate of a P-channel third transistor having a source coupled to the first supply voltage and a drain coupled to a gate of the pull-up transistor, and applying a second input current to a gate of an N-channel second transistor having a source coupled to a second supply voltage and a gate of an N-channel fourth transistor having a source coupled to the second supply voltage;

(b) producing a first delayed signal on a gate of a P-channel fifth transistor by means of a first feedback circuit having an input coupled to the gate of the pull-up transistor, a source of the P-channel fifth transistor is coupled to a drain of the P-channel first transistor and a drain coupled to a gate of the pull-down transistor and a drain of the N-channel second transistor, and an output coupled to a gate of the fifth transistor to cause the P-channel fifth transistor to turn on the pull-down transistor a first predetermined amount of time after the pull-up transistor is turned completely off so as to prevent any shoot-through current from flowing through the pull-up transistor and the pull-down transistor; and (c) producing a second delayed signal on a gate of a sixth transistor by means of a second feedback circuit having an input coupled to the gate of the pull-down transistor, a source of the sixth transistor is coupled to source a drain of the N-channel fourth transistor and a drain coupled to the gate of the pull-up transistor, and an output coupled to the gate of the sixth transistor to cause the sixth transistor to turn on the pull-up transistor a second predetermined amount of time after the pull-down transistor is turned completely off so as to prevent any shoot-through current from flowing through the pull-up transistor and the pull-down transistor.

13. A CMOS circuit including a P-channel pull-up transistor and an N-channel pull-down transistor, comprising:

(a) a P-channel first transistor having a source coupled to a first supply voltage and a gate coupled to an input terminal for receiving an input voltage, and an N-channel second transistor having a source coupled to a second supply voltage and a gate coupled to the input terminal;

(b) a P-channel third transistor having a source coupled to the first supply voltage, a gate coupled to the input terminal, and a drain coupled to a gate of the pull-up transistor, and an N-channel fourth transistor having a source coupled to the second supply voltage and a gate coupled to the input terminal;

(c) a first feedback circuit having an input coupled to the gate of the pull-up transistor and an output coupled to a gate of a P-channel fifth transistor having a source coupled to a drain of the first transistor and a drain coupled to a gate of the pull-down transistor and a drain of the N-channel second transistor, and a second feedback circuit having an input coupled to the gate of the pull-down transistor and an output coupled to a gate of an N-channel sixth transistor having a source coupled to a drain of the fourth transistor and a drain coupled to the gate of the pull-up transistor;

(d) the first feedback circuit producing a first delayed signal on the gate of the P-channel fifth transistor which causes the P-channel fifth transistor to turn on the pull-down transistor a first predetermined amount of time after the pull-up transistor is turned completely off so as to prevent any shoot-through current from flowing through the pull-up transistor and the pull-down transistor, the second feedback circuit producing a second delayed signal on the gate of the sixth transistor which causes the sixth transistor to turn on the pull-up transistor a second predetermined amount of time after the pull-down transistor is turned completely off so as to prevent any shoot-through current from flowing through the pull-up transistor and the pull-down transistor.

* * * * *